US012402227B2

(12) United States Patent
Shoop et al.

(10) Patent No.: US 12,402,227 B2
(45) Date of Patent: Aug. 26, 2025

(54) SYSTEMS AND METHODS FOR EMULATING AN ENVIRONMENT CREATED BY THE OUTPUTS OF A PLURALITY OF DEVICES

(71) Applicant: Adeia Guides Inc., San Jose, CA (US)

(72) Inventors: David Shoop, San Jose, CA (US); Dylan M. Wondra, Mountain View, CA (US)

(73) Assignee: Adeia Guides Inc., San Jose, CA (US)

( * ) Notice: Subject to any disclaimer, the term of this patent is extended or adjusted under 35 U.S.C. 154(b) by 0 days.

(21) Appl. No.: 18/205,666

(22) Filed: Jun. 5, 2023

(65) Prior Publication Data
US 2023/0328864 A1 Oct. 12, 2023

Related U.S. Application Data

(63) Continuation of application No. 17/150,597, filed on Jan. 15, 2021, now Pat. No. 11,711,879, which is a continuation of application No. 16/155,622, filed on Oct. 9, 2018, now Pat. No. 10,932,344.

(51) Int. Cl.
G06F 13/10 (2006.01)
A63J 5/02 (2006.01)
H04L 12/28 (2006.01)
H05B 47/155 (2020.01)
(52) U.S. Cl.
CPC .............. *H05B 47/155* (2020.01); *A63J 5/02* (2013.01); *G06F 13/105* (2013.01); *H04L 12/2825* (2013.01)

(58) Field of Classification Search
CPC ........ H05B 47/155; A63J 5/02; G06F 13/105; H04L 12/2825
See application file for complete search history.

(56) References Cited

U.S. PATENT DOCUMENTS 9,332,622 B1 * 5/2016 Dutt ....................... H05B 47/19
9,769,582 B1 9/2017 Lin
10,932,344 B2 2/2021 Shoop et al.
(Continued)

FOREIGN PATENT DOCUMENTS

EP 2315442 A1 4/2011
WO 2005084339 A2 9/2005

OTHER PUBLICATIONS

International Search Report and Written Opinion of PCT/US2019/055471 dated Mar. 16, 2020.

*Primary Examiner* — Michael W Choi
(74) *Attorney, Agent, or Firm* — Haley Guiliano LLP

(57) ABSTRACT

Systems and methods are disclosed for emulating an environment created by the outputs of a plurality of devices. The system receives device control data for a device in a first venue. The control of the outputs of said devices according to the device control data creates an environment within the first venue. The system retrieves profile data for devices within a second venue. The system associates a device in the second venue with a device from the first venue, both devices having a similar output type. The system then generates control information adapted from the associated device of the first venue for the device in the second venue. The system controls the outputs of each device in the second plurality of devices according to the generated control information to emulate the environment within the first venue in the second venue.

20 Claims, 12 Drawing Sheets

(56) References Cited

U.S. PATENT DOCUMENTS

| | | |
|---|---|---|
| 2004/0252486 A1 | 12/2004 | Krause |
| 2007/0250191 A1 | 10/2007 | Rourke et al. |
| 2010/0005062 A1 | 1/2010 | Van |
| 2012/0047435 A1 | 2/2012 | Holladay et al. |
| 2016/0195864 A1 | 7/2016 | Kim |
| 2017/0006334 A1 | 1/2017 | Beckett et al. |
| 2018/0027352 A1 | 1/2018 | Robinson et al. |
| 2019/0209806 A1 | 7/2019 | Allen et al. |
| 2021/0233489 A1* | 7/2021 | Pavic ............... G06F 3/147 |
| 2021/0235564 A1 | 7/2021 | Shoop et al. |

* cited by examiner

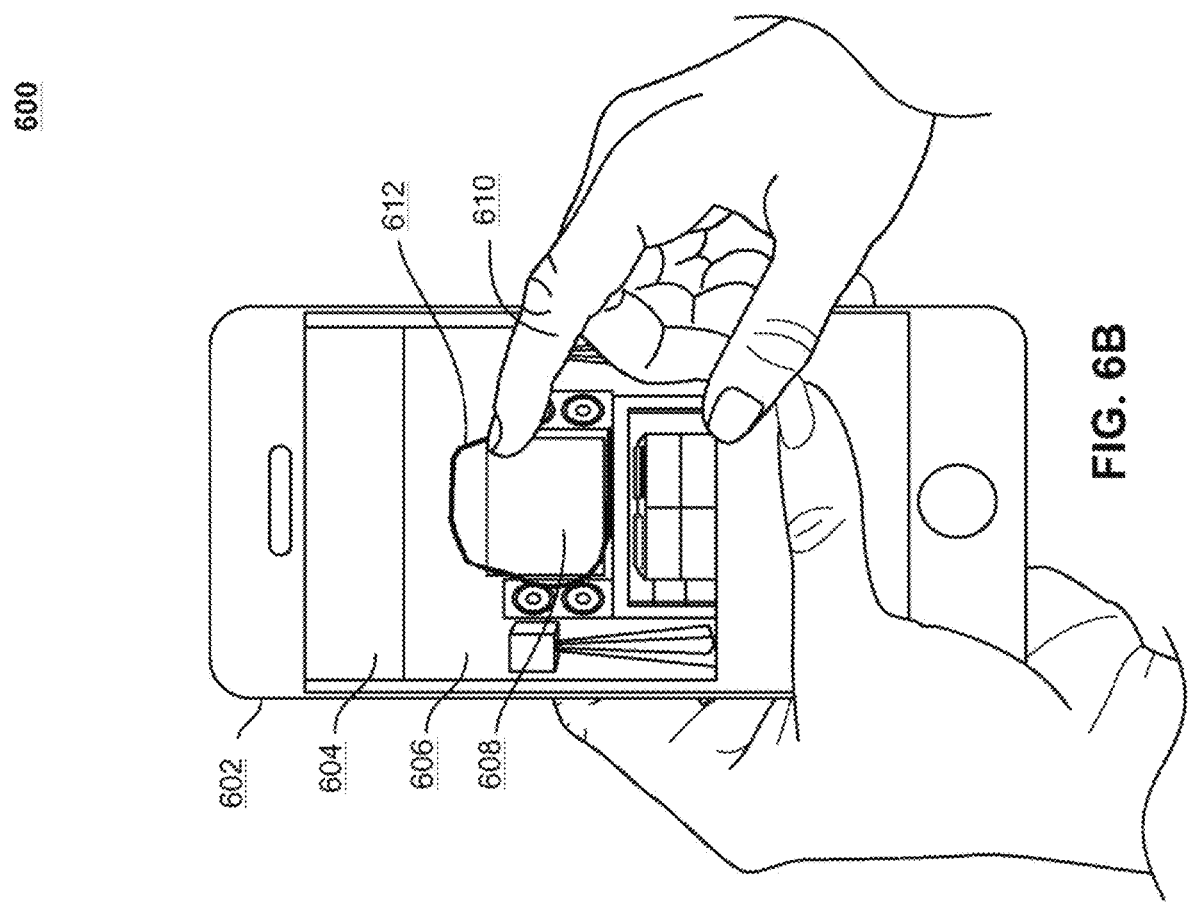
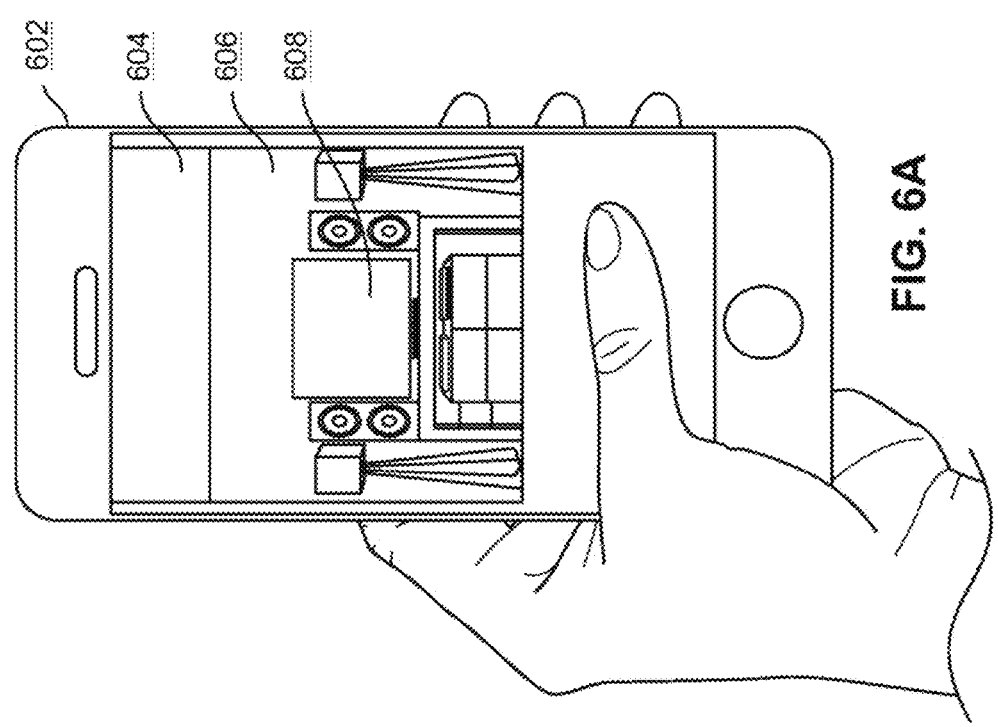
FIG. 6A
FIG. 6B

SYSTEMS AND METHODS FOR EMULATING AN ENVIRONMENT CREATED BY THE OUTPUTS OF A PLURALITY OF DEVICES

CROSS-REFERENCE TO RELATED APPLICATION

This application is a continuation of U.S. patent application Ser. No. 17/150,597, filed Jan. 15, 2021, which is a continuation of U.S. patent application Ser. No. 16/155,622, filed Oct. 9, 2018, now U.S. Pat. No. 10,932,344, the disclosures of which are hereby incorporated by reference herein in their entireties.

BACKGROUND

The present disclosure is directed to controlling functionality of network-connected devices. More particularly the present disclosure is directed to controlling functionality of network-connected devices for emulating an environment of a first venue created by the output of the said devices to a second venue.

SUMMARY

In an event such as a concert, movie screening, play, and similar experiences, the environment created at the venue provides for a memorable aspect of the event experience. The environment at the venue may be created by, for example, lighting, sound, and display technology. Emulating this environment at the event venue to an alternate venue remains technologically challenging. Despite hardware profiles existing for individual aspects of the technology used at a venue (e.g., DMX-512 profiles for lighting), there still lacks a technological technique for emulating the specific effect in an environment created at a second venue where the technology and characteristics of the venue may be different.

Accordingly, systems and methods are disclosed herein for emulating an environment created by the outputs of a plurality of devices. For example, the emulation system described herein provides for an improvement in venue emulation by generating control information for devices in an alternate venue based on the effect that devices of a first venue have on the environment in the first venue. The effect that the original settings achieved in the first venue are adapted for the devices of the second venue.

The emulation system receives control data for devices in a first venue that creates an environment within a first venue. The emulation system then retrieves profile data (including output type and parameters) for devices within a second venue. Each device in the first venue having a similar output type to a device in the second venue is associated by the emulation system. The association may be based on the device control data and the output types of the profile data. The emulation system then generates control information for devices in the second venue. The control information is adapted from the device data of the associated device in the first venue based on output type and parameters of the device in the second venue. Finally, the emulation system may control the outputs of devices in the second venue according to the generated control information to emulate the environment within the first venue in the second venue.

The emulation system may determine an effect on the environment of the first venue created by the device in the first venue. The determined effect is based on venue characteristics of the first venue and received device control data.

The emulation system generates control information for each device in the second plurality based on parameters of the device in the second venue, the venue characteristics of the second venue, and the determined effect of an associated device in the first venue. Finally, the emulation system sets the generated control information for the device in the second venue to achieve the determined effect.

In an example for achieving the determined effect for an audio device, the emulation system may provide control information for an audio device to include an audio output level. In this scenario, the characteristics of the first venue include an acoustic model of the first venue. The emulation system determines a decibel level of audio output by an audio device in the first venue based on at least the audio output level and the acoustic model. The emulation system then generates control information for an audio device in the second venue.

The emulation system determines a level of output for the audio device in the second venue to achieve the decibel level based on the second venue characteristics and parameters of the device in the second venue. Finally, the emulation system sets the generated control information for audio output for the audio device in the second venue.

In an example for achieving the determined effect for a lighting device, the emulation system may provide control information for a lighting device to include a lighting intensity level. In this scenario, the characteristics of the first venue include a luminescent model of the first venue. The emulation system determines a lux output level of lighting output by a lighting device in the first venue based on at least the lux output level and the luminescent model. The emulation system then generates control information for a lighting device in the second venue. The emulation system determines a lux output level for the lighting device in the second venue to achieve the lighting level based on second venue characteristics and parameters of the device in the second venue. Finally, the emulation system sets the generated control information for lighting output for the lighting device in the second venue.

In an example for achieving the determined effect for a display device, the emulation system may provide control information for a display device to include a display orientation setting. In this scenario, the characteristics of the first venue include venue geometry of the first venue. The emulation system determines a display orientation setting based on at least the display orientation offset and the venue geometry. The emulation system then generates control information for a display device in the second venue. The emulation system determines a display offset setting for the display device in the second venue to achieve the display orientation setting based on second venue characteristics and parameters of the device in the second venue. Finally, the emulation system sets the generated control information for altered display in the second venue.

The current emulation system may determine a distance differential weight to determine the effect on the environment of the first venue created by the device. This includes the emulation system determining a first venue distance from a device in the first venue to a location for intended event consumption in the first venue. The emulation system also determines a second venue distance from the device in the second venue to a location for intended event consumption in the second venue. The emulation system then determines a distance differential weight based on the difference between the first venue distance and second venue distance.

In variants of the system where the devices are detected in the second venue by a user device, the emulation system may receive an image capture of the second venue from an image capture device (e.g., a digital camera). The emulation system may determine a visual representation of each of the detected devices within the image capture. The emulation system then retrieves device identifiers for each of the devices within the image capture from a first database. Finally, the emulation system retrieves profile data for each of the devices, based on the device identifiers, within the image capture from a second database.

The emulation system may receive an identified selection of the image capture when determining the visual representation of each of the second plurality of devices within the image capture. The identified selection may be a portion of the image capture to determine the visual representation of a particular device. Within the portion of the image capture, the emulation system determines the visual representation of the particular device.

BRIEF DESCRIPTION OF THE DRAWINGS

The below and other objects and advantages of the disclosure will be apparent upon consideration of the following detailed description, taken in conjunction with the accompanying drawings, in which like reference characters refer to like parts throughout, and in which:

FIGS. 6A and 6B show illustrative embodiments of a user interface depicting an identified selection of an image capture on a mobile application;

DETAILED DESCRIPTION

Figure 1:
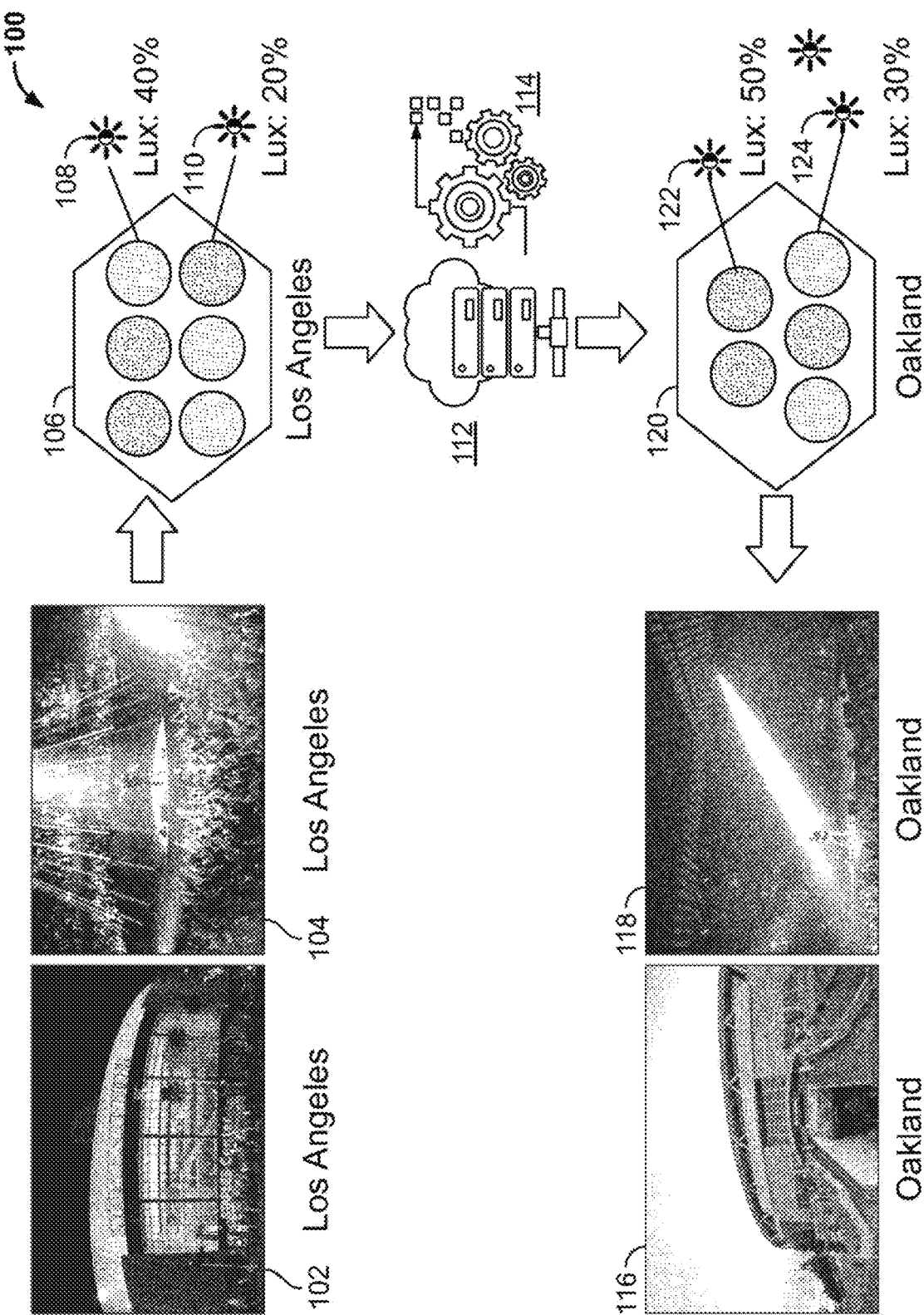
FIG. 1 shows an illustrative embodiment of an associated device in a first venue being adapted for a device in a second venue.

FIG. 1 shows an illustrative embodiment of an emulation system 100 that aims to emulate the environment from a first venue (e.g., Staples Center in Los Angeles, California) 102 to a second venue (e.g., Oracle Arena in Oakland, California) 116. Staples Center includes multiple light grids creating a surrounding beam formation 104 around the performer. An example of a (3×3) light grid used in Staples Center is illustrated 106. Each of the individual lights within the light grid has corresponding settings and parameters. For example, here, the top-right light in the light grid has a lux rating of 40% of maximum lux output 108. Similarly, the bottom-right light in the light grid has a lux rating of 20% of maximum lux output 110. The environment controller may be a remote server 112 in this example having processing capability 114 and interacting with devices in first and second venues. The emulation system, based on the device control data, generates control information by adapting the device control data to control the outputs of the devices in Oracle Arena. The light grid in the Oracle Arena 120 is a (3×2) light grid and does not perfectly match the light grid from Staples Center 106. Therefore, the emulation system generates control information for the Oracle Arena light grid to have the lux output at 50% 122 and 30% 124 respectively. The overall effect is similar and emulates the environment had at Staples Center.

The environment controller may receive device control data for devices in a first venue. Control of the outputs of the first plurality of devices, according to the device control data, creates an environment within a first venue. Device control data may be specific parameters, settings, configurations, mappings, and coordinated outputs for a device within the first plurality of devices. For example, if the device is a light grid, the control data may include a timed schedule for a light program, specific intensities for each function of the light (e.g., different bulbs, etc.), angle and orientation of the grid, and real-time feedback information for real-time calibration. In another example, if the device is a speaker grid, the control data may include a timed schedule for audio playback, specific decibel levels for each audio playback, audio spatial effects, and real-time feedback information for real-time calibration. In some embodiments, the first venue is a plurality of venues. Each of the venues may have their own respective environments. For example, if there is an event which spans multiple venues simultaneously (e.g., New Year's celebrations in Los Angeles, San Diego, and San Francisco), then the first venue may include each of these multiple venues and respective environment.

The emulation system may retrieve profile data for devices in a second venue. The profile data comprises an output type of the device, and parameters for the output type.

An output type may be retrieved from the device itself, where the device may have the output type stored in a memory module of the device. In other embodiments, the output type may be determined from parameters for the output type. For example, if the parameters are measured in lumens, light intensity lux units, and other indicators of light-based measurements, the output type may be determined to be "lighting" based on matching the types of parameters to units of a particular output type (e.g., lighting). For example, continuing from FIG. 1, the emulation system would retrieve a profile for the second device (e.g., (3×2) light grid 120) in the second venue (e.g., Oakland). Here, the parameters may be the lux parameters set to 50% lux 122 and 30% lux 124 respectively. The emulation system retrieves the output type of device from the light grid itself, which identifies the device of a "lighting" output type.

The emulation system may associate each device in the first venue with a device in the second venue having a similar output type. The association may be based on device control data and/or output types of the profile data. For example, continuing from FIG. 1, the emulation system associates the 3×3 light grid 106 from Staples Center with the 3×2 light grid 120 from Oracle Arena as both devices have similar output types (e.g., lighting).

The emulation system may generate, for each device in the second venue, control information adapted from the device control data for the associated device of the first venue based on parameters of the output type of the device. For example, continuing from FIG. 1, the emulation system generates control information for the 3×2 light grid 120 from Oracle Arena based partly on the lux settings, 108 and 110, of the 3×3 light grid 106 in Staples Center adapted to the Oracle Arena 116.

The emulation system application may control the outputs of each device in the second venue according to the generated control information, to emulate the environment within the first venue in the second venue. For example, continuing from FIG. 1, the emulation system executes the generated control information to control the 3×2 light grid 120 from Oracle Arena to emulate the 3×3 light grid 106 from Staples Center.

Figure 2:
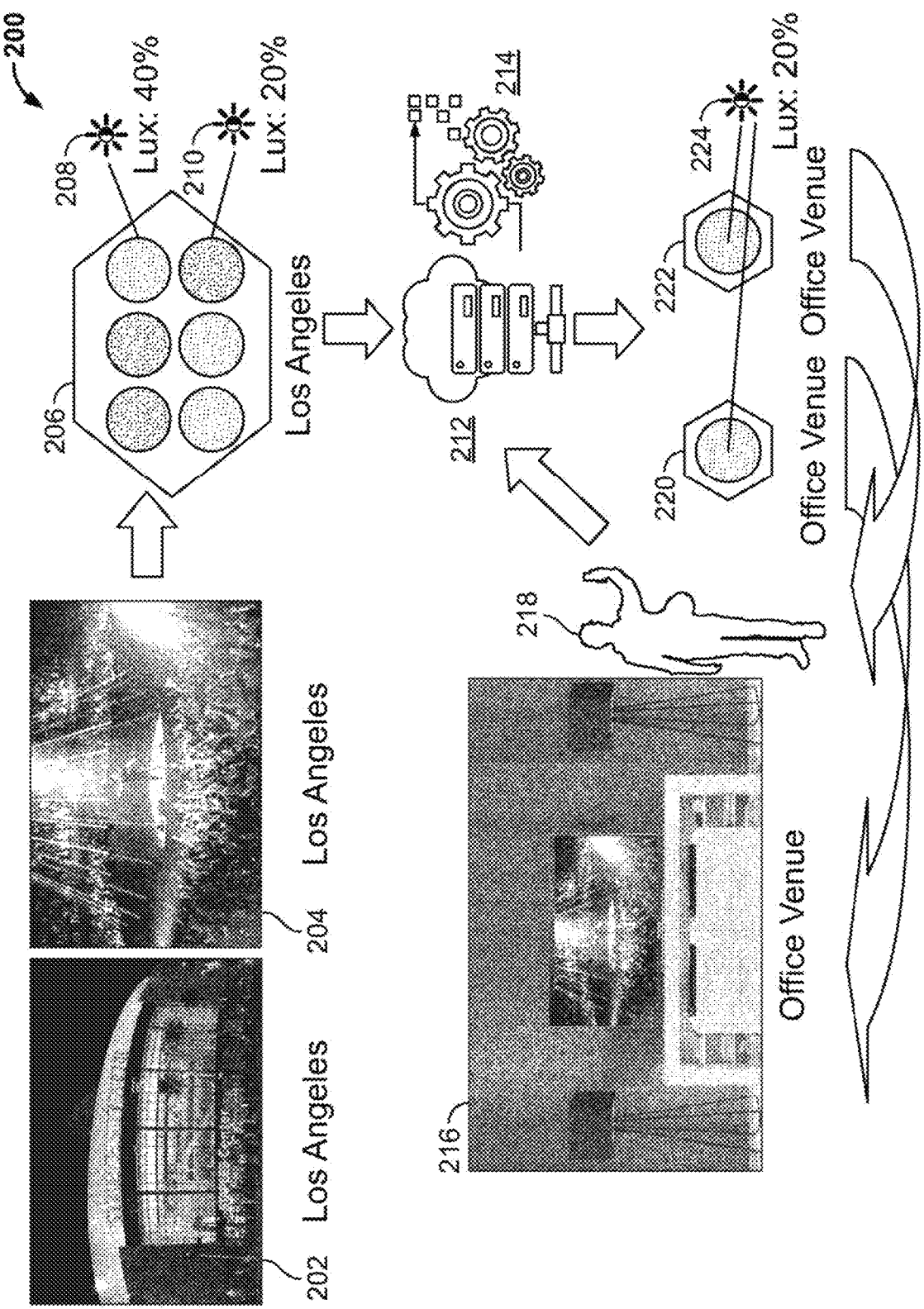
FIG. 2 shows another illustrative embodiment of an associated device in a first venue being adapted for a device in a second venue.

In another illustrative example, FIG. 2 shows an illustrative embodiment of an associated device in a first venue being adapted for a device in a second venue. An emulation system 200 aims to emulate the environment at Staples Center in Los Angeles, California 202 in a user's 218 office venue 216. Staples Center includes multiple light grids creating a surrounding beam formation 204 around the performer. An example of a (3×3) light grid used in Staples Center is illustrated 206. Each of the individual lights within the light grid are corresponding settings and parameters. For example, here, the top-right light in the light grid has a lux rating of 40% of maximum lux output 208. Similarly, the bottom-right light in the light grid has a lux rating of 20% of maximum lux output 210. The environment controller is a remote server 212 in this example having processing capability 214. The emulation system receives device control data for the office venue through an augmented reality mobile application of the user's 218 mobile phone, which captures the entire office venue through an augmented reality user interface. The emulation system, based on the device control data, generates control information by adapting the device control data to control the outputs of the devices in the office venue. The office venue includes two network-connected lamps 220 and 222, which have lux ratings of 20% maximum lux output. Therefore, the emulation system generates control information for the Oracle Arena light grid to have the lux output at 50% 122 and 30% 124 respectively. The overall effect is similar and emulates the environment had at Staples Center.

Figure 3:
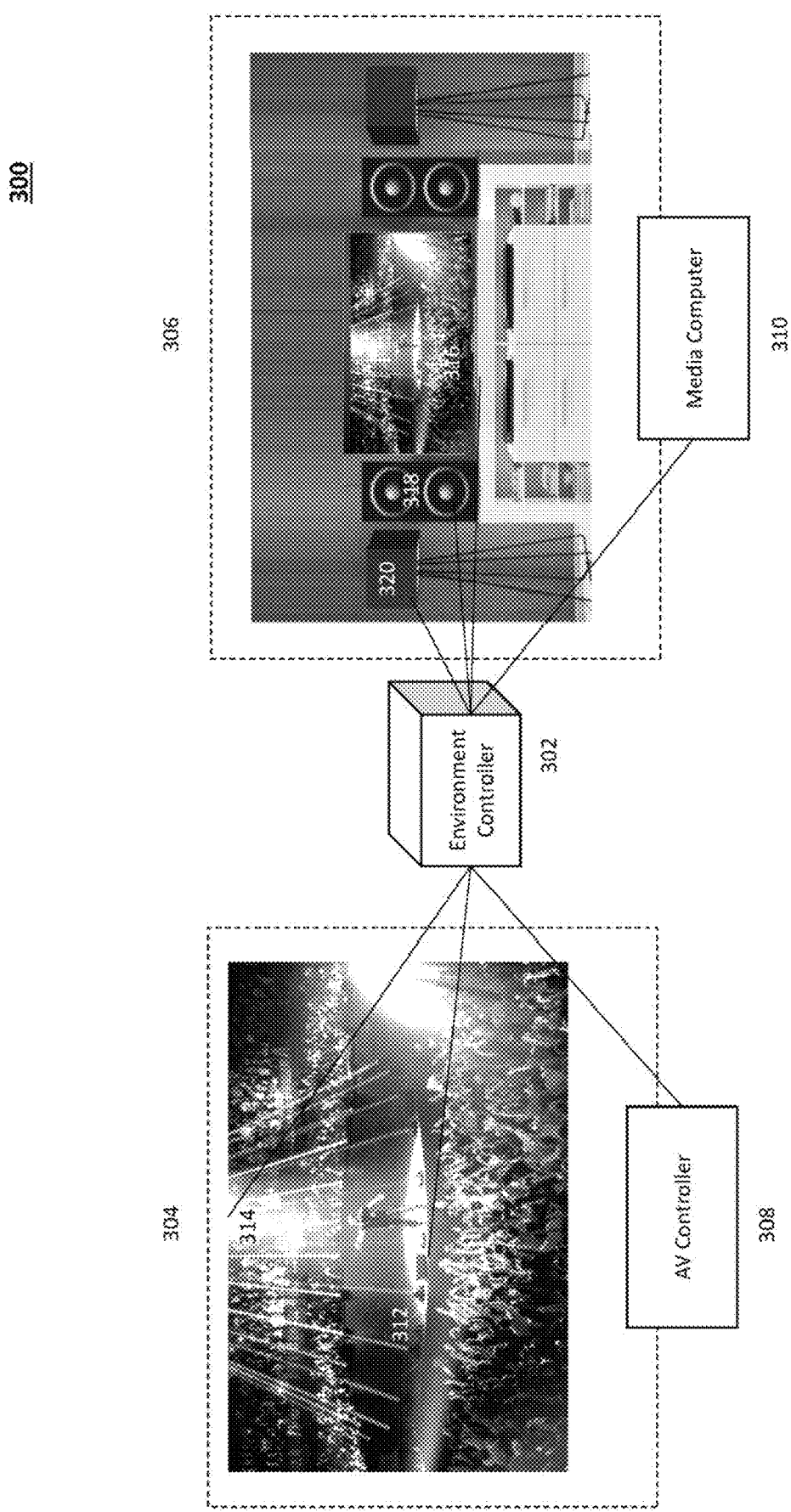
FIG. 3 shows a system diagram of the emulation system including the environment controller, first venue devices, and second venue devices, in accordance with some embodiments of the disclosure.

FIG. 3 shows an illustrative system diagram of the emulation system including the environment controller, first venue devices, and second venue devices, in accordance with some embodiments of the disclosure. The emulation system 300 includes an environment controller 302 which interacts with devices in both a first venue 304 and second venue 306 for emulating an environment of first venue in the second venue. For example, the first venue is Staples Center in Los Angeles, California where a stage light 314 and speaker grid 312 provide device control information to the environment controller 302. In some embodiments, the first venue may use an audio video ("AV") controller 308, which coordinates all device control information and related settings/calibrations for devices the first venue. In situations where an AV controller is used in the first venue, the environment controller may communicate with the AV controller. The second venue may be in an office venue including a network-connected lamp 320, speaker 318, and television 316. Similarly, the environment controller 302 is connected to the second venue devices. Connection between the environment controller 302 and the devices in the first and second venues may be connected through a wireless or wired network.

Figure 4:
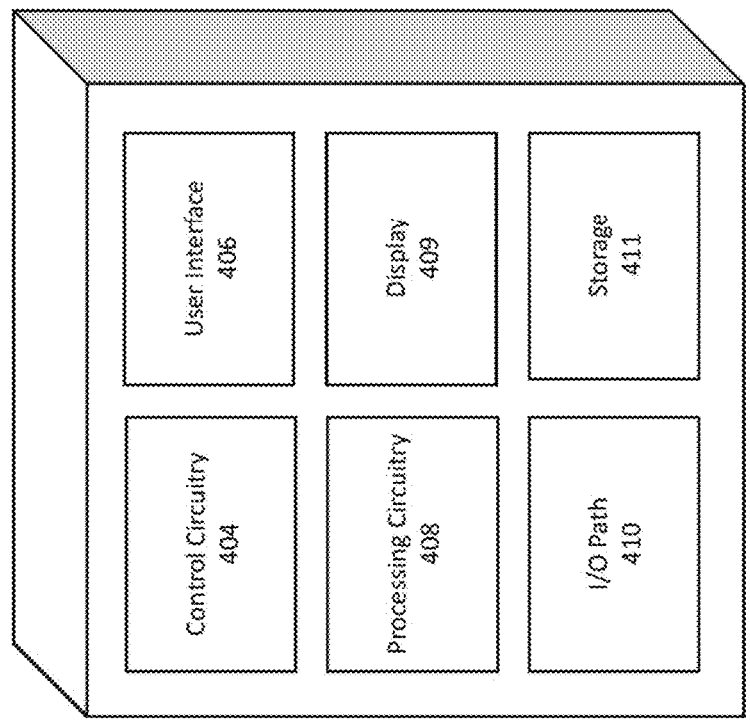
FIG. 4 shows a block diagram of the environment controller, in accordance with some embodiments of the disclosure.

In another illustrative example, FIG. 4 shows a block diagram of the environment controller in accordance with some embodiments of the disclosure. FIG. 4 shows generalized embodiments of illustrative environment controller device 400.

In some embodiments, display 409 may be a television display, computer display, touchscreen display, smartphone display, or wearable device display. In some embodiments, the environment controller may be communicatively connected to user interface 406. In some embodiments, user interface input 406 may be a remote-control device. In some embodiments, the environment controller may include processing circuitry, control circuitry, and storage (e.g., RAM, ROM, Hard Disk, Removable Disk, etc.). The environment controller may include an input/output path 410. I/O path 410 may provide device information, media content, or other data over a local area network (LAN) or wide area network (WAN), and/or other content and data to control circuitry 404, which includes processing circuitry 408 and storage 411. Control circuitry 404 may be used to send and receive commands, requests, and other suitable data using I/O path 410. I/O path 410 may connect control circuitry 404 (and specifically processing circuitry 408) to one or more communications paths.

Control circuitry 404 may be based on any suitable processing circuitry such as processing circuitry 408. As referred to herein, processing circuitry should be understood to mean circuitry based on one or more microprocessors, microcontrollers, digital signal processors, programmable logic devices, field-programmable gate arrays (FPGAs), application-specific integrated circuits (ASICs), etc., and may include a multi-core processor (e.g., dual-core, quad-core, hexa-core, or any suitable number of cores) or supercomputer. In some embodiments, processing circuitry may be distributed across multiple separate processors or processing units, for example, multiple of the same type of processing units (e.g., two Intel Core i7 processors) or multiple different processors (e.g., an Intel Core i5 processor and an Intel Core i7 processor). In some embodiments, control circuitry 404 executes instructions for an emulation system application stored in memory (i.e., storage 508).

Specifically, control circuitry 404 may be instructed by the emulation system application and/or guidance system application to perform the functions discussed above and below. In some embodiments, the guidance system application communicates through the emulation system application. In yet other embodiments, the guidance system application may retrieve information from the emulation system application and perform actions. For example, the emulation system application may provide instructions to control circuitry 404 to generate the media guidance displays. In some implementations, any action performed by control circuitry 404 may be based on instructions received from the emulation system application.

In client/server based embodiments, control circuitry 404 may include communications circuitry suitable for communicating with a guidance application server or other networks or servers. Communications circuitry may include a cable modem, an integrated services digital network (ISDN) modem, a digital subscriber line (DSL) modem, a telephone modem, Ethernet card, or a wireless modem for communications with other equipment, or any other suitable communications circuitry. Such communications may involve the Internet or any other suitable communications networks or paths. In addition, communications circuitry may include circuitry that enables peer-to-peer communication of environment controller devices, or communication of environment controller devices in locations remote from each other (described in more detail below).

Memory may be an electronic storage device provided as storage 411 that is part of control circuitry 404. As referred to herein, the phrase "electronic storage device" or "storage device" should be understood to mean any device for storing electronic data, computer software, or firmware, such as random-access memory, read-only memory, hard drives, optical drives, digital video disc (DVD) recorders, compact disc (CD) recorders, BLU-RAY disc (BD) recorders, BLU-RAY 3D disc recorders, digital video recorders (DVR, sometimes called a personal video recorder, or PVR), solid state devices, quantum storage devices, gaming consoles, gaming media, or any other suitable fixed or removable storage devices, and/or any combination of the same. Storage 411 may be used to store various types of content described herein as well as media guidance data described above. Nonvolatile memory may also be used (e.g., to launch a boot-up routine and other instructions).

Control circuitry 404 may include video, audio, and light configuration circuitry and tuning circuitry, such as one or more analog tuners, one or more MPEG-2 decoders or other digital decoding circuitry, high-definition tuners, or any other suitable tuning or video circuits or combinations of such circuits. Encoding circuitry (e.g., for converting over-the-air, analog, or digital signals to MPEG signals for storage) may also be provided. Control circuitry 404 may also include scaler circuitry for up-converting and down-converting content into the preferred output format. Control circuitry 404 may also include digital-to-analog converter circuitry and analog-to-digital converter circuitry for converting between digital and analog signals. The tuning and encoding circuitry may be used by the environment controller device to receive and to display, to play, or to record content. The tuning and encoding circuitry may also be used to receive guidance data. The circuitry described herein, including, for example, the tuning, video generating, encoding, decoding, encrypting, decrypting, scaler, and analog/digital circuitry, may be implemented using software running on one or more general purpose or specialized processors. Multiple tuners may be provided to handle simultaneous tuning functions (e.g., watch and record functions, picture-in-picture (PIP) functions, multiple-tuner recording, etc.).

A user may send instructions to control circuitry 404 using user interface 406. User input interface 406 may be any suitable user interface, such as a remote control, mouse, trackball, keypad, keyboard, touchscreen, touchpad, stylus input, joystick, voice recognition interface, or other user input interfaces. Display 409 may be provided as a stand-alone device or integrated with other elements of each one of environment controller device 402. For example, display 409 may be a touchscreen or touch-sensitive display. In such circumstances, user input interface 406 may be integrated with or combined with display 409. Display 409 may be one or more of a monitor, a television, a liquid crystal display (LCD) for a mobile device, amorphous silicon display, low temperature poly silicon display, electronic ink display, electrophoretic display, active matrix display, electro-wetting display, electrofluidic display, cathode ray tube display, light-emitting diode display, electroluminescent display, plasma display panel, high-performance addressing display, thin-film transistor display, organic light-emitting diode display, surface-conduction electron-emitter display (SED), laser television, carbon nanotubes, quantum dot display, interferometric modulator display, or any other suitable equipment for displaying visual images. In some embodiments, display 409 may be HDTV-capable. In some embodiments, display 409 may be a 3D display, and the interactive emulation system application and any suitable content may be displayed in 3D. A video card or graphics card may generate the output to the display 409. The video card may offer various functions such as accelerated rendering of 3D scenes and 2D graphics, MPEG-2/MPEG-4 decoding, TV output, or the ability to connect multiple monitors. The video card may be any processing circuitry described above in relation to control circuitry 404. The video card may be integrated with the control circuitry 404.

The environment controller system 400 may be implemented using any suitable architecture. For example, it may be a stand-alone application wholly implemented on the environment controller 402. In such an approach, instructions of the application are stored locally (e.g., in storage 411), and data for use by the application is downloaded on a periodic basis (e.g., from an out-of-band feed, from an Internet resource, or using another suitable approach). Control circuitry 404 may retrieve instructions of the application from storage 411 and process the instructions to generate any of the displays discussed herein. Based on the processed instructions, control circuitry 404 may determine what action to perform when input is received from input interface 406. For example, movement of a cursor on a display up/down may be indicated by the processed instructions when input interface 406 indicates that an up/down button was selected.

The environment controller 402 may be coupled to a communications network. The communications network may be one or more networks including the Internet, a mobile phone network, mobile voice or data network (e.g., a 4G or LTE network), cable network, public switched telephone network, or other types of communications network or combinations of communications networks. Paths may separately or together include one or more communications paths, such as a satellite path, a fiber-optic path, a cable path, a path that supports Internet communications (e.g., IPTV), free-space connections (e.g., for broadcast or other wireless signals), or any other suitable wired or wireless communications path or combination of such paths.

Figure 5:
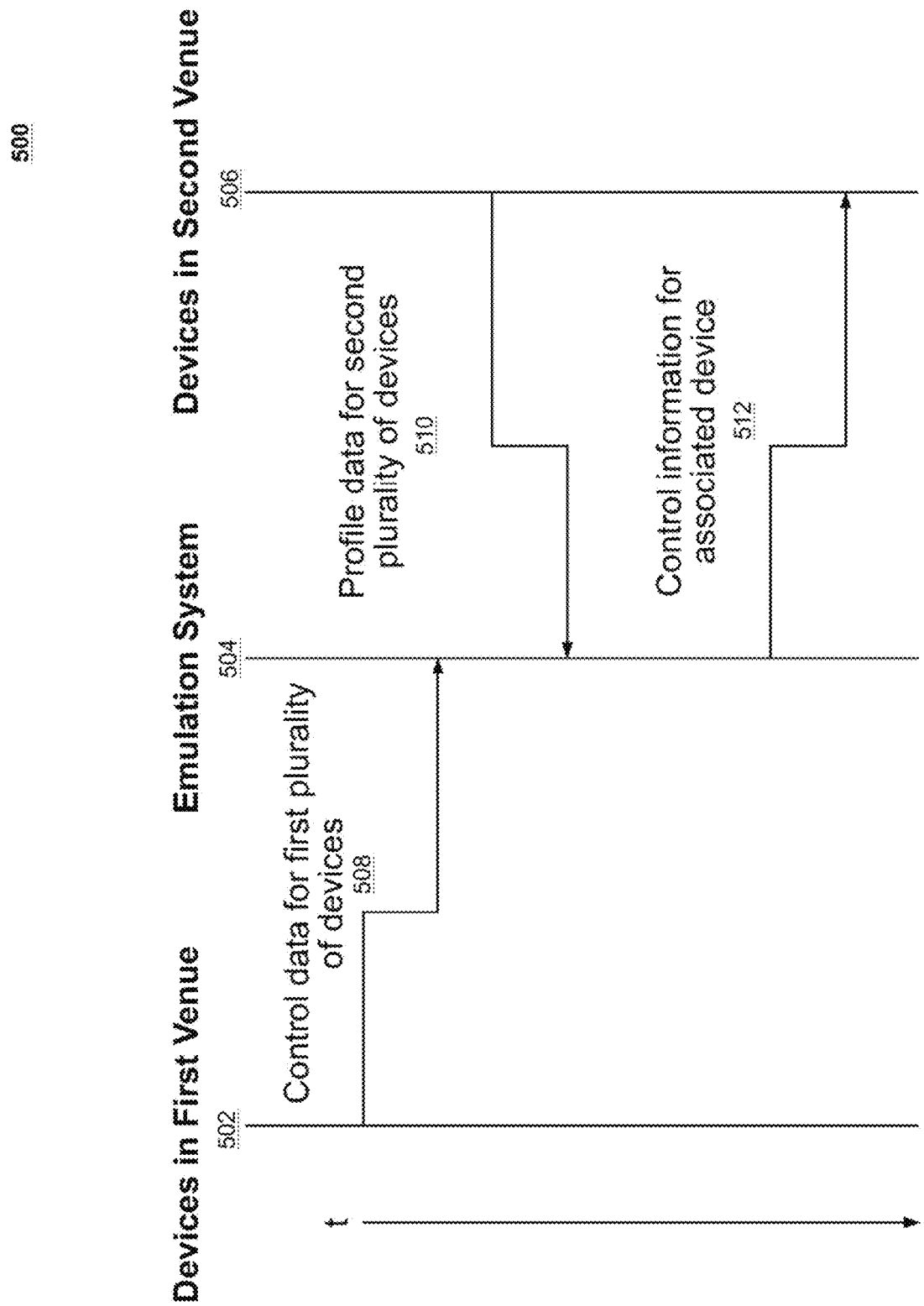
FIG. 5 shows a data flow diagram of the emulation system and first and second plurality of devices, in accordance with some embodiments of the disclosure.

FIG. 5 shows an illustrative data flow diagram 500 of the emulation system and first and second plurality of devices. The emulation system 504 receives control data for a first plurality of devices 508 from the devices in the first venue 502. Subsequently, the emulation system receives profile data for the second plurality of devices 510 from devices in second venue 506. For each of the first plurality of devices, the emulation system 504 associates a device in the second plurality of devices having a similar output type. The emulation system 504 then generates control information adapted from the device control data for the associated device of the first plurality. Finally, the emulation system 504 controls the outputs of each device in the second venue 506 according to the control information for devices in the second plurality 512.

The emulation system may determine an effect on the environment of the venue created by a device of the venue based on venue characteristics. Venue characteristics may include any measurable metric in a venue in relation to a device. These venue characteristics apply to both a first venue and a second venue. More specifically, the venue characteristics may include, but are not limited to, venue dimensions, venue geometry, acoustic model of venue, luminescent model of venue, seating capacity of venue, venue effect preferences, venue adaptation based on environmental conditions, and device distance from location of intended event consumption. For example, continuing from FIG. 2, the profile data for the 3×3 speaker grid 206 may include an acoustic model of the Staples Center stadium having information in relation to the travel, attenuation, and geometry of the sound signals output from the first speaker grid.

In some embodiments, the emulation system may determine, for devices in the first venue, an effect on the environment of the first venue created by the devices. The determined effect is based on venue characteristics of the first venue and received device control data. For example, continuing from FIG. 2, the emulation system may determine, based on the received acoustic model and geometry of Staples Center stadium, that there is no resonance in the center of the area, which creates a "muted effect for low frequency."

The emulation system may generate control information for each device in the second venue. This is accomplished by the emulation system determining control information for the device that would achieve the determined effect on the environment of the second venue. The control information is determined by parameters of the device of the second venue, the venue characteristics of the second venue, and the determined effect of an associated device in the first plurality of devices on the environment of the first venue. For example, continuing from FIG. 2, the emulation system may generate control information for both network-connected lamps 220 and 222, in the office venue 216 based on the parameters of the speaker grid 206 from Staples Center 202 (e.g., the associated device), the acoustic model of the office venue (e.g., highly dampened sound due to carpeting), and "muted effect for low frequency" as the determined effect.

In some embodiments, the emulation system may set the generated control information of the device of the second venue to the determined control information. For example, continuing from FIG. 2, the determined control information will be set for both network-connected lamps, 220 and 222.

In a particular example, the emulation system determines the effect on the environment of the first venue created by the device in the first venue, which includes determining a decibel level of audio output. The emulation system also provides for the venue characteristics of the first venue to include the audio output level and the acoustic model. For example, the emulation system may receive an acoustic model of the Oracle Arena and the output levels of the speakers during the concert (e.g., between 100 to 120 decibels).

Following the above example, the emulation system may generate control information for an audio device in the second venue associated with the device from the first venue. The emulation system may determine a level of output for the device in the second venue to achieve the decibel level of audio output in the environment of the second venue. The level of output may be based on at least the venue characteristics of the second venue and the device parameters. The emulation system may set the control information for the device in the second venue to cause the device of the second venue to output audio at the determined level of output. For example, the emulation system may generate control information for right speaker by determining that the concert should be heard at 80 dB (based on the Oracle Arena geometry, and the parameters of the speakers at the Oracle Arena). 80 dB is less than the 100-120 dB heard at the concert, but 80 dB will create the same audio effect in the fan's living room as was created at the concert.

In yet another particular example, the emulation system determines the effect on the environment of the first venue created by the device in the first venue, which includes determining a lighting intensity level. The emulation system also provides for the venue characteristics of the first venue to include a luminescent model of the first venue. The emulation system may determine the effect on the environment of the first venue created by the device of the first venue, which includes determining a lux output level by the device in the venue based on at least the lighting intensity level and the luminescent model. For example, the emulation system may receive a luminescent model of the Oracle Arena and the lighting intensity level of the lighting grid during the concert (e.g., approximately 500 lux).

In some embodiments, the emulation system may generate control information for a lighting device in the second venue associated with the device. The emulation system may determine a level of output for the lighting device to achieve the lux output in the environment of the second venue. The level of output may be based on at least the venue characteristics of the second venue and the parameters for the output type of the device of the second plurality of devices. The emulation system may set the control information for the lighting device of the second venue to cause output at the determined level of output. For example, the emulation system may generate control information for a right network-connected lamp having lighting intensity of 150 lux (based on the living room geometry, and the parameters of the right network-connected lamp). 150 lux is less than the 500 lux seen at the concert, but 150 lux will create the same lighting effect in the fan's living room as was created at the concert.

In yet another particular example, the emulation system determines the effect on the environment of the first venue created by the device in the first venue, which includes determining a display orientation setting. The emulation system also provides for the venue characteristics of the first venue to include venue geometry of the first venue. The emulation system may determine the effect on the environment of the first venue created by the display device, which includes determining a display offset based on the display orientation setting and the venue geometry. Display orientation may include the physical orientation of the display relative to the geometry of the venue. In other cases, display orientation may describe the media generated for display being altered in a specific fashion to display at a different orientation. In other examples, a mixture of the two would be implemented. For example, the emulation system may receive a venue geometry of the Oracle Arena and the display orientation setting of a large visual display used during the concert (e.g., approximately [30–x, 5–y, 5–z] degree offset).

In some embodiments, the emulation system may generate control information for a display device of the second venue. The emulation system may determine a degree of offset for the display device of the second venue to achieve the display offset in the environment of the second venue. The degree of offset may be based on at least the venue characteristics of the second venue and the parameters for the output type of the display device. The emulation system may set the control information for the display device to generate for display at the determined degree of offset. For example, the emulation system may generate control information for a television having a programmable mount having an offset of [20–x, 1–y, 1–z] (based on the living room geometry and the parameters of the television in the living room). This altered setting will create the same visual effect in the fan's living room as was created at the concert.

The emulation system may determine a first venue distance from the device in the first venue to a location for intended event consumption in the first venue. The first venue distance is based on retrieved venue geometry of the first venue. For example, continuing from FIG. 2, the emulation system may determine that the intended ideal spectator is situated at center stage 200 feet from light grid 206. The emulation system may then calculate the distance between center stage in Staples Center 202 and the light grid 206.

In some embodiments, the emulation system may determine a second venue distance from a device in the second venue to a location for intended event consumption in the second venue. The second venue distance is based on retrieved venue geometry of the second venue. For example, continuing from FIG. 2, the emulation system may determine, based on the geometry of the office venue, that the intended ideal spectator is situated an equal distance between the right network-connected lamp 222 and a work table in the office venue 216. The emulation system may then calculate the distance between the right network-connected lamp 222.

The emulation system may determine a distance differential weight based on the difference between the first venue distance and second venue distance. By determining a distance differential weight based on the difference between the first venue distance and second venue distance, the emulation system can more accurately calculate the effect on the environment of the second venue created by the device. For example, continuing from FIG. 2, the emulation system may calculate the distance differential weight by determining the difference between the distance of the center stage and the light grid 206 at Staples Center 202, and between the right network-connected lamp 222 and a work table in the office venue 216.

FIGS. 6A and 6B show illustrative embodiments of a user interface depicting an identified selection of an image capture on a mobile application. The emulation system may receive information for user computer equipment with augmented reality capability. The augmented reality embodiment 600 includes user computer equipment 602 (e.g., a smartphone, or any other suitable electronic device capable of image capture and network connectivity). In this example, the smartphone is running a software application that allows a user to capture a venue through a user interface 604. The smartphone may be used to capture a venue (e.g., living room 606) using the camera of the smartphone. A television 608 may be detected by the software application. In some variants, a user may make a selection 612 on the user interface 604 using a touch interface 610 or any other suitable interface for selection (e.g., keyboard, mouse, eye-tracking, and similar techniques.).

The emulation system may receive an image capture of the second venue from an image capture device. By receiving an image capture of the second venue from an image capture device, the emulation system may determine the specific devices used in the second venue. For example, continuing from FIGS. 6A and 6B, a smartphone 602 may be used to retrieve profile data for devices in the living room 606 shown in the user interface 604 of the smartphone. The user may use the smartphone 602 to take a still image of the room or pan across the room to cover some or all of the area of the second venue.

The emulation system may determine a visual representation of each device in the second venue within the image capture. For example, continuing from FIGS. 6A and 6B, a smartphone 602 may use an image recognition technique on the image capture (e.g., the still image, video, live feed of the venue) to determine the specific devices, such as the television 608. In other embodiments, a user may provide the information for the specific devices by manual entry of devices, or user selection 610 of the user interface 604 to identify the device.

The emulation system may retrieve device identifiers for each of the devices in the second venue from a first database based on the respective visual representations of each of the second plurality of devices. A device identifier may be any data that characterizes the device. For example, the emulation system may, based on the recognized devices from the image capture, retrieve the device identifier from a first database. The database may provide an associated identifier based on a matching image sent to the database. For example, continuing from FIGS. 6A and 6B, the emulation system may determine that a television 608 is the device identified in living room 606 through the user interface 604. The emulation system may then send the image to a database and receive the device identifier stating that the television is a Sony XBR65 television.

The emulation system may then retrieve profile data for each device in the second venue from a second database based on the device identifiers for each of the devices. For example, continuing from FIGS. 6A and 6B, emulation system may, based on the device identifiers, retrieve the profile data for the Sony XBR65 from the home media PC which stores device profiles for all devices on the local area network.

The emulation system may receive an identified selection of the image capture, wherein the identified selection comprises at least a portion of the image capture to determine the visual representation of a particular device in the second plurality of devices. For example, continuing from FIGS. 6A and 6B, the emulation system may receive an identified selection 612 by a touch interface 610 that aims to restrict the image capture to a particular area for further analysis. This may result in fewer errors of mistaken identity of devices to improve accuracy in present image recognition techniques.

The emulation system may then determine the visual representation of the particular device within the portion of the image capture. For example, continuing from FIGS. 6A and 6B, the emulation system may only determine the device captured within the received encircled section 612 in the image capture.

The emulation system may receive device control data for the first plurality of devices that includes receiving a DMX-512 signal associated with one or more lighting devices. For example, the emulation system may receive a DMX-512 file associated with a light grid at the Staples Center in Los Angeles. By receiving device control data for the first plurality of devices which includes receiving a DMX-512 signal associated with one or more lighting devices, the emulation system may more accurately emulate the environment from a first venue to a second venue.

Figure 7:
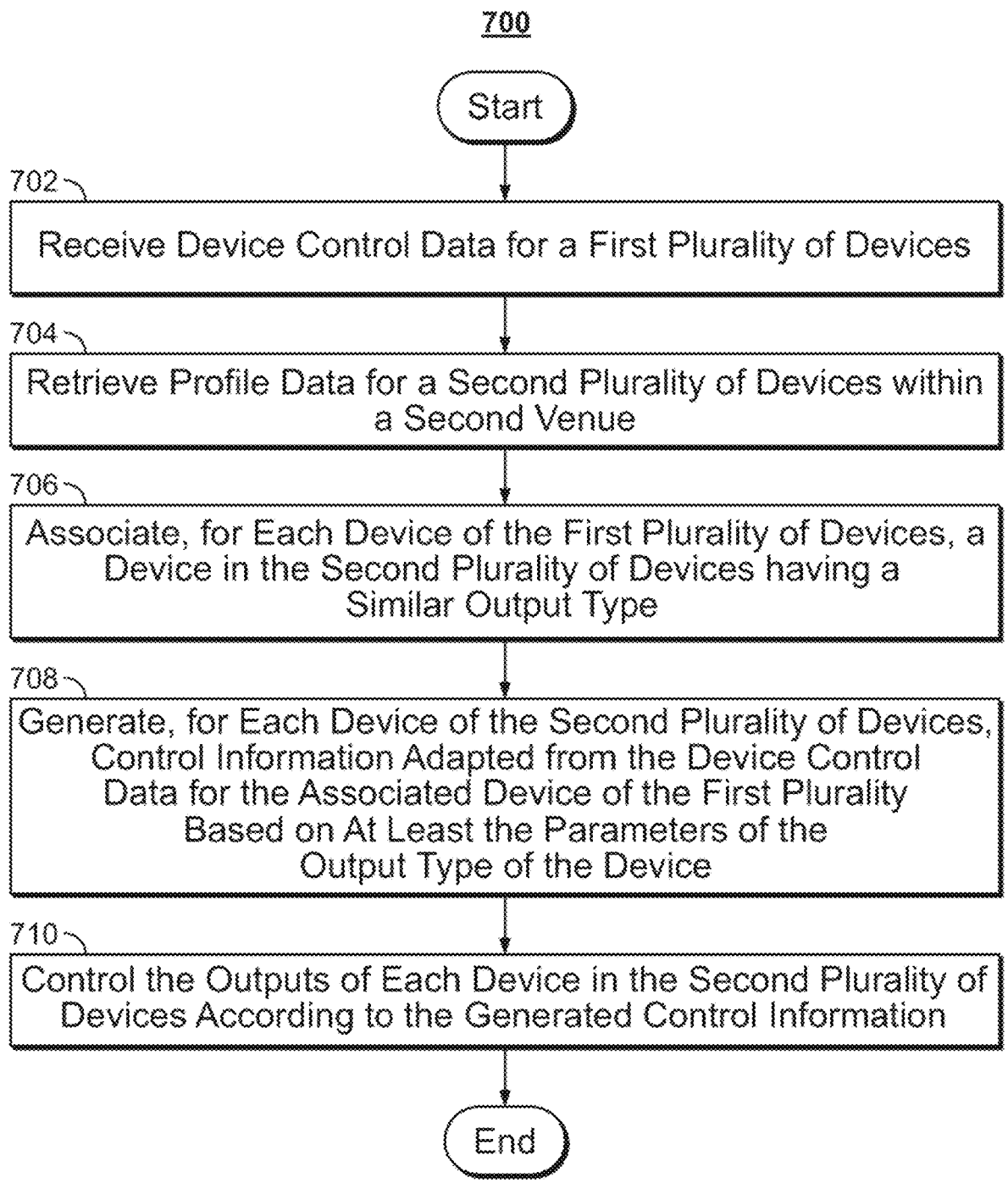
FIG. 7 is an illustrative flowchart of a process for emulating an environment created by the outputs of a plurality of devices, in accordance with some embodiments of the disclosure.

FIG. 7 depicts an illustrative flowchart of a process 700 for emulating an environment created by the outputs of a plurality of devices, in accordance with some embodiments of the disclosure. Process 700, and any of the following processes, may be executed by control circuitry 404 (e.g., in a manner instructed to control circuitry 404 by the emulation system or emulation system application). Control circuitry 404 may be part of an environment controller (e.g., environment controller 402, which may have any or all of the functionality of wireless user communication devices, audio visual equipment, and/or media content devices), or of a remote server separated from the environment controller by way of a communication network, or distributed over a combination of both.

At 702, the emulation system, by control circuitry 404, receives device control data for a first plurality of devices. The control of the outputs of said devices according to the device control data creates an environment within a first venue. The environment controller (e.g., a remote server) receives device control data for a first plurality of devices. The device control data for a first plurality of devices may be retrieved, at the environment controller, from a first venue information source (e.g., a database). In other embodiments, the device control data for a first plurality of devices is retrieved from one or more wireless user communication devices. For example, the device control data is received from a mobile application after verifying multiple devices on a network and receiving device control data for all participating devices. In another embodiment, the emulation system receives device information from an augmented reality system which detects devices through image recognition through augmented reality in real time and receives information about the detected devices. In other embodiments, the device control data for a first plurality of devices is stored by a media content source, and thus the environment controller retrieves the device control data from the media content source. The environment controller may interface with all of these entities using I/O path 410.

At 704, the emulation system, by control circuitry 404, retrieves profile data for a second plurality of devices within a second venue. The profile data for the second plurality of devices comprises for each device in the second plurality an output type of the device and parameters for the output type. The profile data for the second plurality of devices may be retrieved from a device information database. In other embodiments, the profile data for the second plurality of devices is retrieved from the user audio video equipment (e.g., television, speaker, network-connected lamp). In other variants, the profile data for the second plurality of devices may be stored in the media content source and may be retrieved from the media content source. In yet other embodiments, the profile data for the second plurality of devices may be retrieved from the individual wireless user communication devices. In some embodiments, the second venue may use a media computer which coordinates all device control information and related settings/calibrations for devices in the second venue. In situations where a media computer is used in the second venue, the environment controller may communicate with the environment controller. In some embodiments, the emulation system may retrieve profile data for each device in the second venue from a second database based on the device identifiers for each of the devices. The second database may be any database that provides profile data of the second plurality of devices, including databases within a local area network such as an electronic receiver, a media PC server, a smartphone, a computer, or any other locally connected computer with a database. The second database may also be a third-party server, accessed on a wide area network, which provides information for consumer electronics.

At 706, the emulation system, by control circuitry 404, associates a device in the second plurality of devices having a similar output type based on at least the device control data and the output types of the profile data. The association of the device in the second plurality of devices having a similar output type is executed by processing circuitry 408.

At 708, the emulation system, by control circuitry 404, generates control information adapted from the device control data for the associated device of the first plurality based on at least the parameters of the output type of the device. The generation of control information is executed by processing circuitry 408.

At 710, the emulation system, by control circuitry 404, controls the outputs of each device in the second plurality of devices according to the generated control information to emulate the environment within the first venue in the second venue. The controlling of the outputs is executed by processing circuitry 408. The controls are sent from the environment controller, through the communications network, to the user audio visual equipment.

Figure 8:
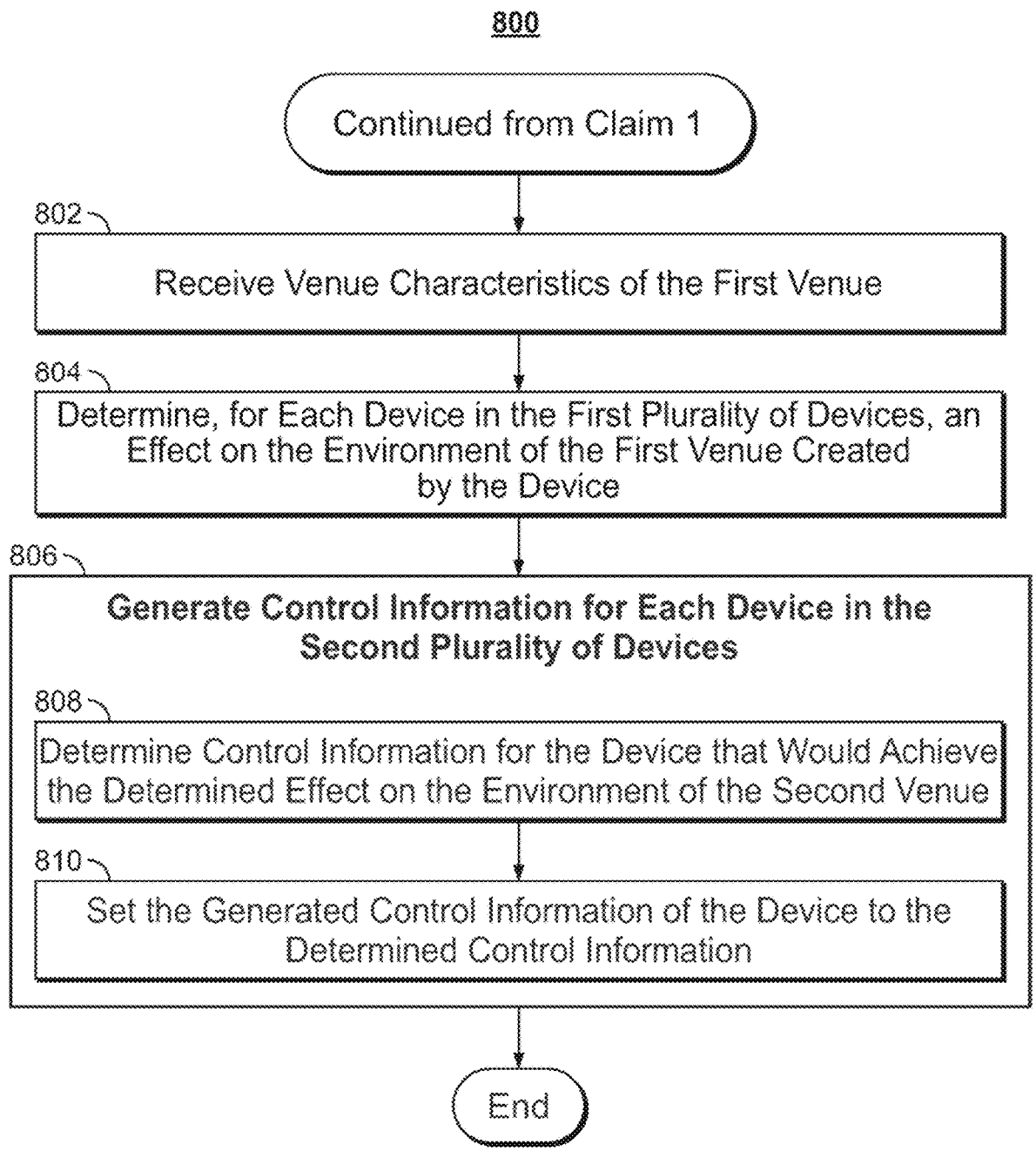
FIG. 8 is an illustrative flowchart of a process for determining an effect of the environment of the first venue, in accordance with some embodiments of the disclosure.

FIG. 8 depicts an illustrative flowchart of a process 800 for determining an effect of the environment of the first venue, in accordance with some embodiments of the disclosure.

At 802, the emulation system, by control circuitry 404, receives venue characteristics of the first venue. The venue characteristics may be received from the first venue information source database. In other embodiments, the venue characteristics may be received from the device information database. In yet other embodiments, the venue characteristics may be stored locally in the environment controller.

At 804, the emulation system, by control circuitry 404, determines an effect on the environment of the first venue created by the device for each of the devices in the first plurality of devices. In some embodiments, the determination of the effect is executed by the processing circuitry. The determination of the effect is based on venue characteristics of the first venue and the received device control data. The venue characteristics and received device control data may be received from the first venue information source database.

At 806, the emulation system, by control circuitry 404, generates control information for each device in the second plurality of devices. In some embodiments, the generation of information is performed by processing circuitry 408. Generation of the control information comprises steps 808 and 810.

At 808, the emulation system, by control circuitry 404, determines control information for the device that would achieve the determined effect on the environment. In some embodiments, the determining of control information is performed by processing circuitry 408. The control information is based on parameters of the device in the second plurality of devices, the venue characteristics of the second venue, and the determined effect of an associated device in the first plurality of devices on the environment of the first venue. In some embodiments, the parameters and/or the venue characteristics of the second venue of the device in the second plurality of devices are received at the environment controller from a device information database. In some embodiments, the parameters and/or the venue characteristics of the second venue of the device in the second plurality of devices are received from the user audio visual equipment (e.g., an environment controller). In some embodiments, the determined effect of an associated device in the first plurality of devices on the environment in the first venue is retrieved from at least one of a media content source database, a first venue information source database, or an environment controller.

At 810, the emulation system, by control circuitry 404, sets the generated control information for the device to the determined control information. In some embodiments, the setting of generated control information is performed by processing circuitry 408. Instructions may be sent over the communication network to an environment controller such as user audio video equipment.

Figure 9:
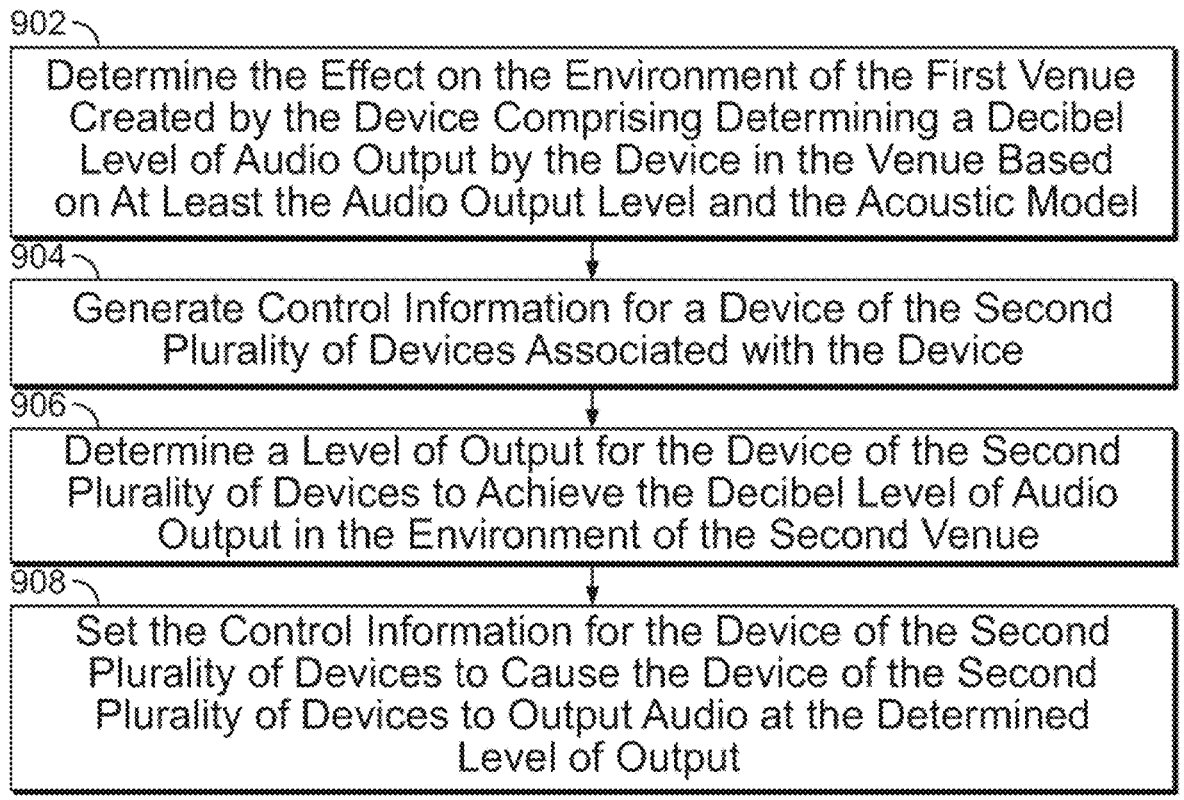
FIG. 9 is an illustrative flowchart of a process for generating and setting control information for the device of the second plurality of devices to cause the device to output audio at a determined level of output, in accordance with some embodiments of the disclosure.

FIG. 9 depicts a process 900 for generating and setting control information for the device of the second plurality of devices to cause the device to output audio at the determined level of output, in accordance with some embodiments of the disclosure. At 902, the emulation system, by control circuitry 404, determines the effect on the environment of the first venue created by the device comprising determining a decibel level of audio output by the device in the venue based on at least the audio output level and the acoustic model. In some embodiments, the determination of the decibel level of audio output is executed by processing circuitry 408. The acoustic model may be retrieved from one of the first venue information source database, device information database, or environment controller.

At 904, the emulation system, by control circuitry 404, generates control information for each device in the second plurality of devices. In some embodiments, the generation of information is performed by processing circuitry 408. Generation of the control information comprises steps 906 and 908.

At 906, the emulation system, by control circuitry 404, determines a level of output for the device that would achieve the decibel level of audio output in the environment of the second environment. In some embodiments, the determining level of output for the device is performed by processing circuitry 408. The level of output for the device is based on venue characteristics of the second venue, a level of output for the device of the second plurality of devices, and the determined effect of an associated device in the first plurality of devices on the environment of the first venue. In some embodiments, the parameters and/or the venue characteristics of the second venue of the device in the second plurality of devices are received at the environment controller from a device information database. In some embodiments, the parameters and/or the venue characteristics of the second venue of the device in the second plurality of devices are received from the user audio visual equipment (e.g., an environment controller). In some embodiments, the determined effect of an associated device in the first plurality of devices on the environment in the first venue is retrieved from at least one of a media content source, a first venue information source database, or an environment controller.

At 908, the emulation system, by control circuitry 404, sets the generated control information for the second plurality of devices to cause the device of the second plurality of devices to output audio at the determined level of output. In some embodiments, the setting of generated control information is performed by processing circuitry 408. Instructions may be sent over the communication network to an environment controller such as user audio video equipment.

Figure 10:
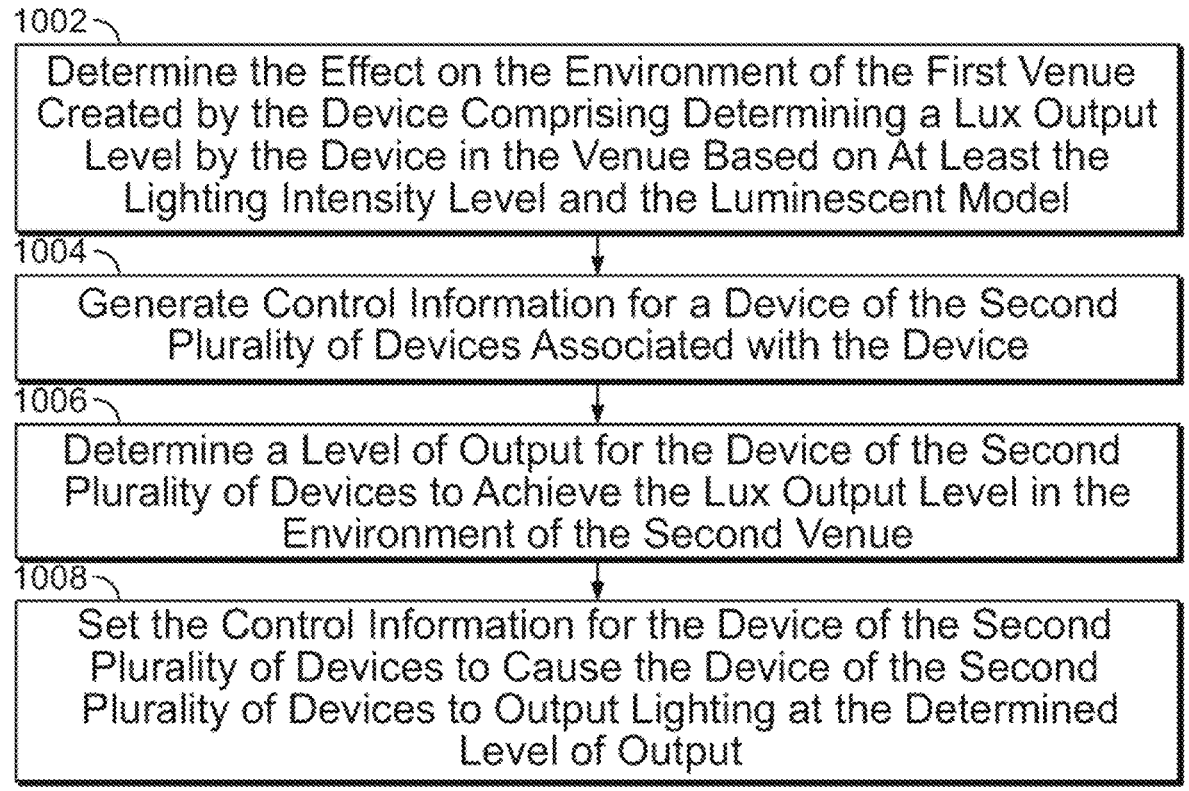
FIG. 10 is an illustrative flowchart of a process for generating and setting control information for the device of the second plurality of devices to cause the device to output lighting at the determined level of output, in accordance with some embodiments of the disclosure.

FIG. 10 depicts a process 1000 for generating and setting control information for the device of the second plurality of devices to cause the device to output lighting at the determined level of output, in accordance with some embodiments of the disclosure. At 1002, the emulation system, by control circuitry 404, determines the effect on the environment of the first venue created by the device comprising determining a lux output level by the device in the venue based on at least the lighting intensity level and the luminescent model. In some embodiments, the determination of the lux output level is executed by processing circuitry 408. The luminescent model may be retrieved from one of the first venue information source database, device information database, or environment controller.

At 1004, the emulation system, by control circuitry 404, generates control information for each device in the second plurality of devices. In some embodiments, the generation of information is performed by processing circuitry 408. Generation of the control information comprises steps 906 and 908.

At 1006, the emulation system, by control circuitry 404, determines a level of output for the device that would achieve the lux output level in the environment of the second venue of the second environment. In some embodiments, the determining level of output for the device is performed by processing circuitry 408. The level of output for the device is based on venue characteristics of the second venue, a level of output for the device of the second plurality of devices, and the determined effect of an associated device in the first plurality of devices on the environment of the first venue. In some embodiments, the parameters and/or the venue characteristics of the second venue of the device in the second plurality of devices are received at the environment controller device from a device information database. In some embodiments, the parameters and/or the venue characteristics of the second venue of the device in the second plurality of devices are received from the user audio visual equipment (e.g., an environment controller device). In some embodiments, the determined effect of an associated device in the first plurality of devices on the environment in the first venue is retrieved from at least one of a media content source, a first venue information source database, or an environment controller.

At 1008, the emulation system, by control circuitry 404, sets the generated control information for the second plurality of devices to cause the device of the second plurality of devices to output lighting at the determined level of output. In some embodiments, the setting of generated control information is performed by processing circuitry 408. Instructions may be sent over the communication network to an environment controller such as user audio video equipment.

Figure 11:
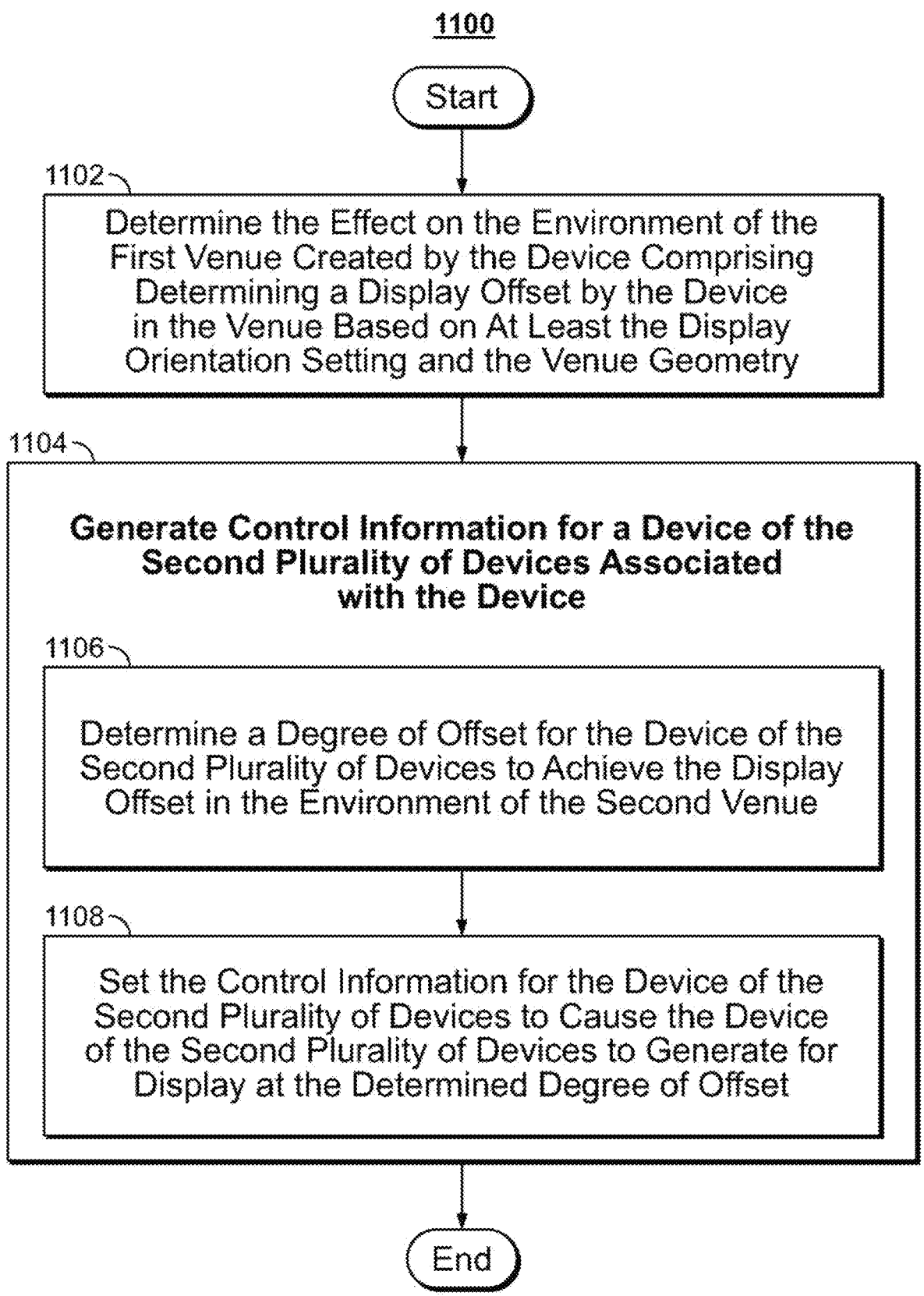
FIG. 11 is an illustrative flowchart of a process for generating and setting control information for the device of the second plurality of devices to cause the device to generate for display at the determined degree of offset, in accordance with some embodiments of the disclosure.

FIG. 11 depicts a process 1100 for generating and setting control information for the device of the second plurality of devices to cause the device to generate for display at the determined degree of offset, in accordance with some embodiments of the disclosure. At 1102, the emulation system, by control circuitry 404, determines the effect on the environment of the first venue created by the device comprising determining display offset by the device in the venue based on at least the display orientation setting and the venue geometry. In some embodiments, the determination of the display offset is executed by processing circuitry 408. The display orientation setting may be retrieved from one of the first venue information source database, device information database, or environment controller.

At 1104, the emulation system, by control circuitry 404, generates control information for each device in the second plurality of devices. In some embodiments, the generation of information is performed by processing circuitry 408. Generation of the control information comprises steps 906 and 908.

At 1106, the emulation system, by control circuitry 404, determines a degree of offset for the device that would achieve the display offset in the environment of the second venue of the second environment. In some embodiments, the determining degree of offset for the device is performed by processing circuitry 408. The degree of offset for the device is based on venue characteristics of the second venue, a degree of offset for the device of the second plurality of devices, and the determined effect of an associated device in the first plurality of devices on the environment of the first venue. In some embodiments, the parameters and/or the venue characteristics of the second venue of the device in the second plurality of devices are received at the environment controller from a device information database. In some embodiments, the parameters and/or the venue characteristics of the second venue of the device in the second plurality of devices are received from the user audio visual equipment (e.g., an environment controller device). In some embodiments, the determined effect of an associated device in the first plurality of devices on the environment in the first venue is retrieved from at least one of a media content source, a first venue information source database, or an environment controller.

At 1108, the emulation system, by control circuitry 404, sets the generated control information for the second plurality of devices to cause the device of the second plurality of devices to generate for display at the determined degree of offset. In some embodiments, the setting of generated control information is performed by processing circuitry 408. Instructions may be sent over the communication network to an environment controller such as user audio video equipment.

Figure 12:
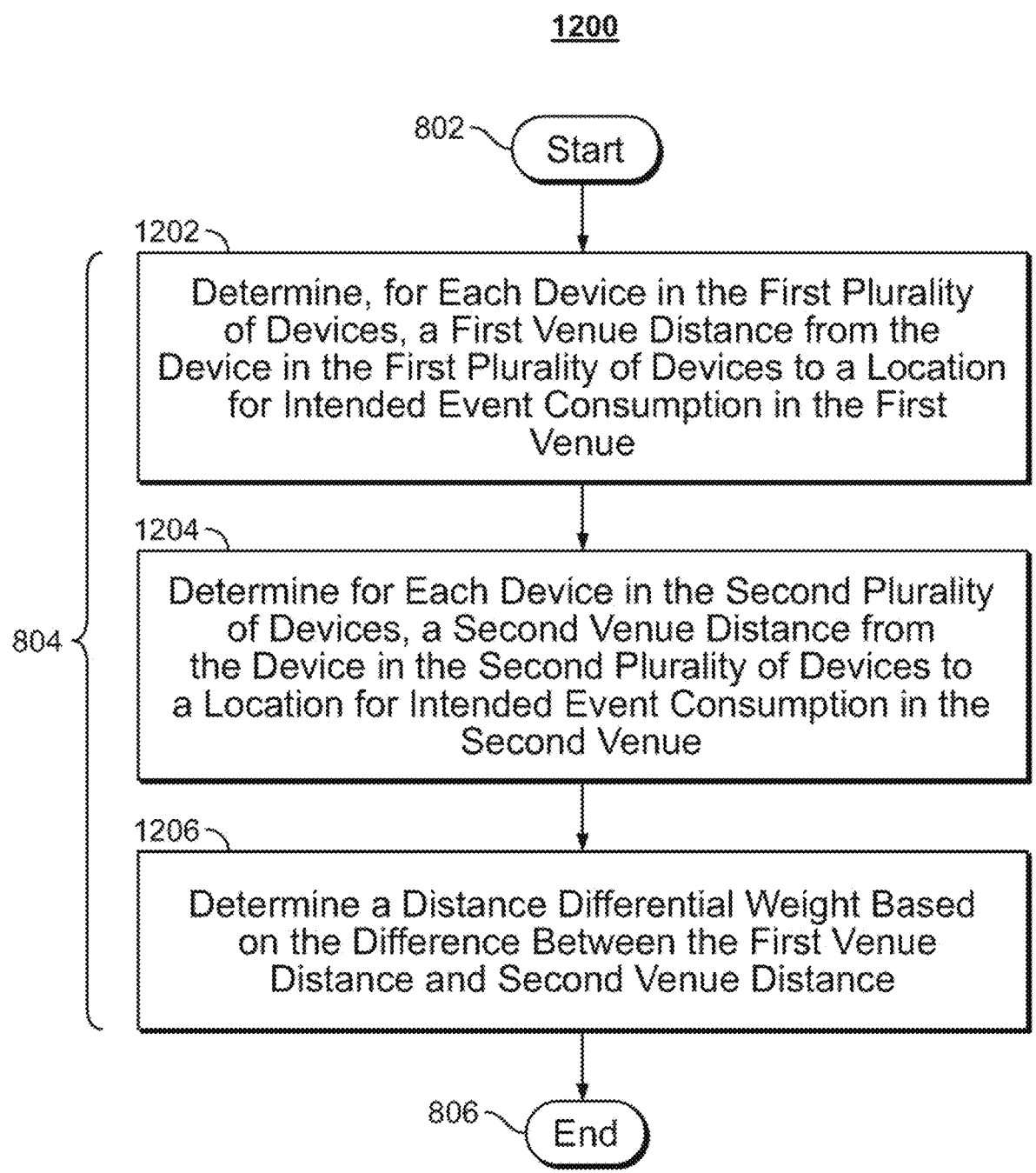
FIG. 12 is an illustrative flowchart of a process for determining a distance differential weight based on the difference between the first venue distance and second venue distance, in accordance with some embodiments of the disclosure.

FIG. 12 depicts a process 1200 for determining a distance differential weight based on the difference between the first venue distance and second venue distance, in accordance with some embodiments of the disclosure. At 1202, the emulation system, by control circuitry 404, determines a first venue distance from the device in the first plurality of devices to a location for intended event consumption in the first venue based on retrieved venue geometry of the first venue. In some embodiments, the determining of the first venue distance from the device is performed by processing circuitry 408. The retrieved venue geometry of the first venue may be retrieved from one or more of a device information database, media content source, first venue information source database, and environment controller.

At 1204, the emulation system, by control circuitry 404, determines a second venue distance from the device in the second plurality of devices to a location for intended event consumption in the second venue based on retrieved venue geometry of the second venue. In some embodiments, the determining of the second venue distance from the device is performed by processing circuitry 408 on at least one of the environment controller devices. The retrieved venue geometry of the second venue may be retrieved from one or more of a device information database, media content source, first venue information source database, and environment controller.

At 1206, the emulation system, by control circuitry 404, determines a distance differential weight based on the difference between the first venue distance and second venue distance. In some embodiments, the determining of the distance differential weight is performed by processing circuitry 408.

Figure 13:
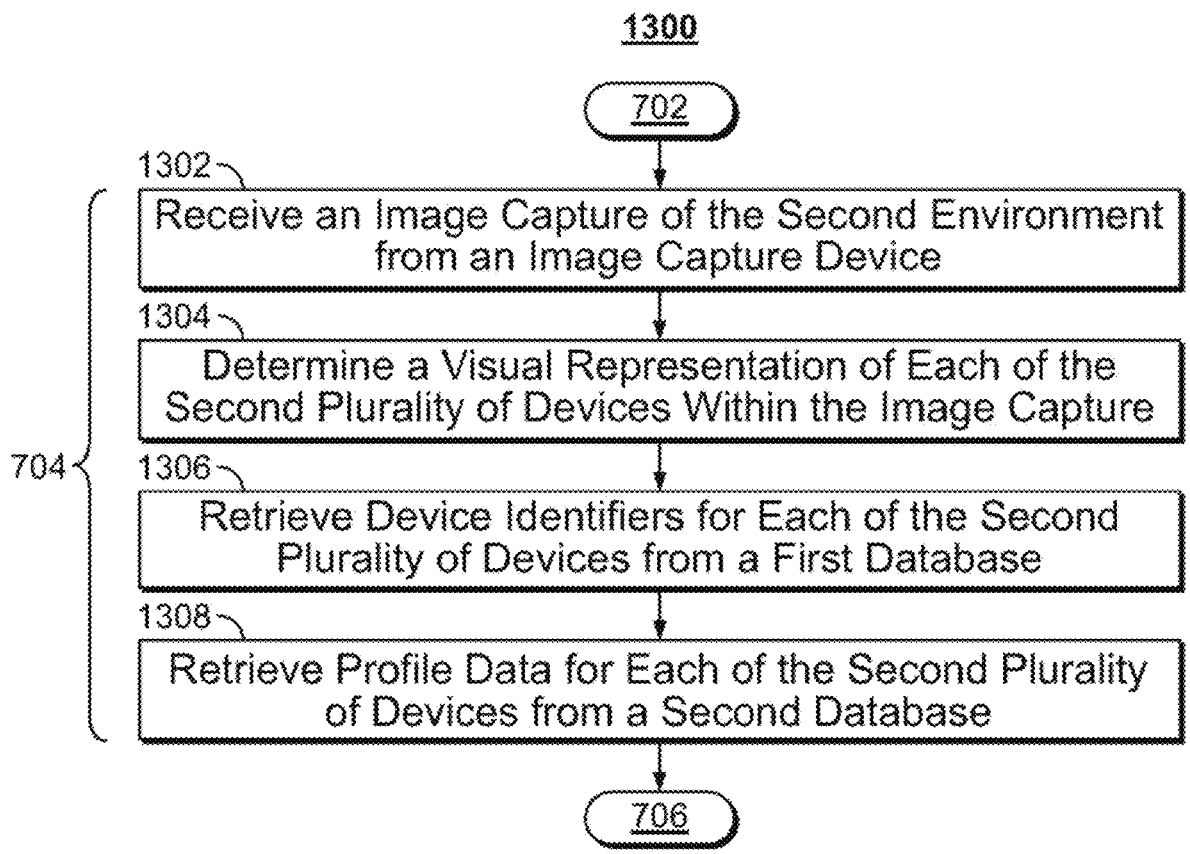
FIG. 13 is an illustrative flowchart of a process for determining a visual representation of each of the second plurality of devices within the image capture, in accordance with some embodiments of the disclosure.

FIG. 13 depicts a process 1300 for determining a visual representation of each of the second plurality of devices within the image capture, in accordance with some embodiments of the disclosure. At 1302, the emulation system, by control circuitry 404, receives an image capture of the second environment from an image capture device. In some embodiments, the image capture device is one of the environment controller devices. The image capture device may be any user computer equipment that has an image capture hardware, network connectivity, and processing means. This may include, but is not limiting to, a smartphone, a tablet, a laptop, a wearable user device (e.g., smart-glasses, a fitness tracker, etc.), and other network-connection capable devices.

At 1304, the emulation system, by control circuitry 404, determines a visual representation of each of the second plurality of devices within the image capture. In some embodiments, the determination of the visual representation is executed by processing circuitry 408.

At 1306, the emulation system, by control circuitry 404, retrieves device identifiers for each of the second plurality of devices from a first database based on the respective visual representations of each of the second plurality of devices. The device identifiers for each of the second plurality of devices may be retrieved from the device information database. In other embodiments, the device identifiers for each of the second plurality of devices may be retrieved from the user audio visual equipment. In yet other embodiments, the device identifiers for each of the second plurality of devices may be retrieved from the media content source.

At 1308, the emulation system, by control circuitry 404, retrieves profile data for each of the second plurality of devices from a second database based on the device identifiers for each of the second plurality of devices. The profile data for each of the second plurality of devices may be retrieved from the device information database. In other embodiments, the profile data for each of the second plurality of devices may be retrieved from the user audio visual equipment. In yet other embodiments, the profile data for each of the second plurality of devices may be retrieved from the media content source.

Figure 14:
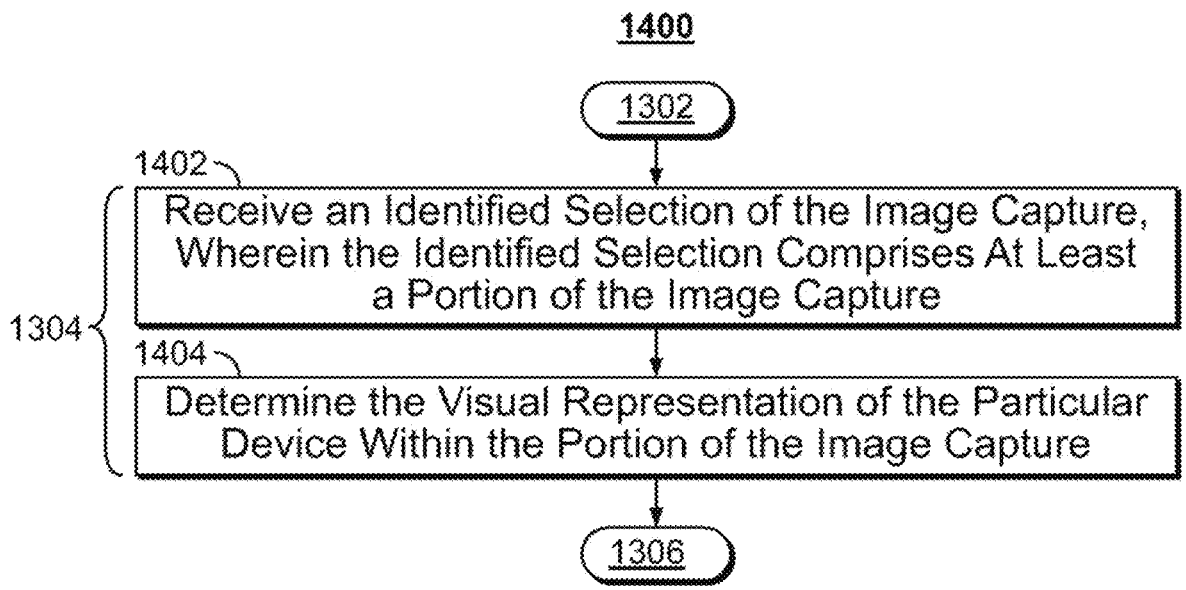
FIG. 14 is an illustrative flowchart of a process for determining, based on a received identified selection of the image capture, the visual representation of the particular device within the portion of the image capture, in accordance with some embodiments of the disclosure.

FIG. 14 depicts a process 1400 for determining, based on a received identified selection of the image capture, the visual representation of the particular device within the portion of the image capture, in accordance with some embodiments of the disclosure. At 1402, the emulation system, by control circuitry 404, receives an identified selection of the image capture, wherein the identified selection comprises at least a portion of the image capture to determine the visual representation of a particular device in the second plurality of devices. In some embodiments, the identified selection of the image capture is received by the environment controller.

At 1404, the emulation system, by control circuitry 404, determines the visual representation of the particular device within the portion of the image capture. The determination of the visual representation of the particular device is executed by processing circuitry 408.

It is contemplated that the steps or descriptions of FIGS. 7-14 may be used with any other embodiment of this disclosure. In addition, the steps and descriptions described in relation to FIGS. 7-14 may be done in alternative orders or in parallel to further the purposes of this disclosure. For example, each of these steps may be performed in any order or in parallel or substantially simultaneously to reduce lag or increase the speed of the system or method. Any of these steps may also be skipped or omitted from the process. Furthermore, it should be noted that any of the devices or equipment discussed in relation to FIGS. 5-6 could be used to perform one or more of the steps in FIGS. 7-14.

The processes discussed above are intended to be illustrative and not limiting. One skilled in the art would appreciate that the steps of the processes discussed herein may be omitted, modified, combined, and/or rearranged, and any additional steps may be performed without departing from the scope of the invention. More generally, the above disclosure is meant to be exemplary and not limiting. Only the claims that follow are meant to set bounds as to what the present invention includes. Furthermore, it should be noted that the features and limitations described in any one embodiment may be applied to any other embodiment herein, and flowcharts or examples relating to one embodiment may be combined with any other embodiment in a suitable manner, done in different orders, or done in parallel. In addition, the systems and methods described herein may be performed in real time. It should also be noted that the systems and/or methods described above may be applied to, or used in accordance with, other systems and/or methods.

What is claimed is:

1. A method comprising:
receiving device control data for a first plurality of devices, wherein control of outputs of the first plurality of devices, according to the device control data, creates an environment at a first venue;
receiving an image capture from a second device from a second venue, wherein the second venue is at a different location than the first venue;
detecting presence of a media display device based on the image capture;
based on detecting the presence of the display device, determining display parameters associated with the media display device; and
controlling output of the media display device present at the second venue to emulate the environment created at the first venue in the second venue based on both (i) the received device control data, and (ii) the determined display parameters.

2. The method of claim 1, wherein the output of the display device is controlled further based on a type of the media display device.

3. The method of claim 2, further comprising, requesting the type of the media display device from a database, wherein the request comprises transmitting the image capture that includes the presence of the media display device.

4. The method of claim 3, further comprising:
in response to the request, receiving a media display device identifier related to the media display device from the database; and
retrieving profile data associated with the media display device based on the received media display device identifier.

5. The method of claim 4, wherein the profile data is retrieved from a second database.

6. The method of claim 1, wherein the environment created at the first venue relates to control of the outputs of the first plurality of devices to create a first luminosity level of lighting intensity and emulating the environment created at the first venue at the second venue comprises controlling the output of the media display device to create the same first luminosity level of lighting intensity.

7. The method of claim 1, wherein controlling the output of the media display device to emulate the environment created at the first venue in the second venue further comprises matching an output type of a first device of the first plurality of devices contributing to the environment created at the first venue to an output type of the media display device at the second venue.

8. The method of claim 7, wherein the output type of the first device is related to any one of audio, video, and lighting output.

9. The method of claim 1, further comprising, matching a timed schedule of the control of the outputs of the first plurality of devices at the media display device.

10. The method of claim 1, further comprising, determining a degree of offset for the output of the media display device present at the second venue to emulate the environment created at the first venue in the second venue.

11. A system comprising:
a communication port;
a memory storing instructions; and
control circuitry communicably coupled to the memory and the communication port and configured to execute instructions to:
receive device control data for a first plurality of devices, wherein control of outputs of the first plurality of devices, according to the device control data, creates an environment at a first venue;
receive an image capture from a second device from a second venue, wherein the second venue is at a different location than the first venue;
detect presence of a media display device based on the image capture;
based on detecting the presence of the media display device, determine display parameters associated with the media display device; and
control output of the media display device present at the second venue to emulate the environment created at the first venue in the second venue based on both (i) the received device control data, and (ii) the determined display parameters.

12. The system of claim 11, wherein the output of the media display device is controlled by the control circuitry further based on a type of the media display device.

13. The system of claim 12, further comprising, the control circuitry configured to request the type of media display device from a database, wherein the request comprises transmitting the image capture that includes the presence of the media display device.

14. The system of claim 13, further comprising, the control circuitry configured to:
in response to the request, receive a media display device identifier related to the media display device from the database; and
retrieve profile data associated with the media display device based on the received media display device identifier.

15. The system of claim 14, wherein the profile data is retrieved by the control circuitry from a second database.

16. The system of claim 11, wherein the environment created at the first venue relates to control of the outputs of the first plurality of devices to create a first luminosity level of lighting intensity and emulating the environment created at the first venue at the second venue by the control circuitry comprises controlling the output of the media display device to create the same first luminosity level of lighting intensity.

17. The system of claim 11, wherein controlling the output of the media display device to emulate the environment created at the first venue in the second venue further comprises, the control circuitry configured to match an output type of a first device of the first plurality of devices contributing to the environment created at the first venue to an output type of the media display device at the second venue.

18. The system of claim 17, wherein the output type of the first device is related to any one of audio, video, and lighting output.

19. The system of claim 11, further comprising, the control circuitry configured to match a timed schedule of the control of the outputs of the first plurality of devices at the media display device.

20. The system of claim 11, further comprising, the control circuitry configured to determine a degree of offset for the output of the media display device present at the second venue to emulate the environment created at the first venue in the second venue.

* * * * *